US012633721B2

(12) United States Patent
Huang et al.

(10) Patent No.: US 12,633,721 B2
(45) Date of Patent: May 19, 2026

(54) UNITIZED LASER CHIP WITH DOUBLE TOPOLOGICAL STRUCTURES

(71) Applicant: SHENZHEN AFALIGHT CO., LTD., Shenzhen (CN)

(72) Inventors: Junbin Huang, Shenzhen (CN); Quanfei Fu, Shenzhen (CN); Xiaoqin Tong, Shenzhen (CN)

(73) Assignee: SHENZHEN AFALIGHT CO., LTD., Shenzhen (CN)

( * ) Notice: Subject to any disclaimer, the term of this patent is extended or adjusted under 35 U.S.C. 154(b) by 829 days.

(21) Appl. No.: 18/074,190

(22) Filed: Dec. 2, 2022

(65) Prior Publication Data

US 2023/0411925 A1 Dec. 21, 2023

(30) Foreign Application Priority Data

Jun. 20, 2022 (CN) .......................... 202210694017.6

(51) Int. Cl.
| | |
|---|---|
| *H01S 5/02345* | (2021.01) |
| *H01S 5/0237* | (2021.01) |
| *H01S 5/026* | (2006.01) |
| *H01S 5/183* | (2006.01) |
| *H01S 5/02* | (2006.01) |

(52) U.S. Cl.
CPC ............ *H01S 5/026* (2013.01); *H01S 5/0237* (2021.01); *H01S 5/1833* (2013.01); *H01S 5/0201* (2013.01); *H01S 5/02345* (2021.01)

(58) Field of Classification Search
CPC ......................................... H01S 5/0233–02375
See application file for complete search history.

(56) References Cited

U.S. PATENT DOCUMENTS

| | | | | |
|---|---|---|---|---|
| 7,656,914 B1* | 2/2010 | Reid | .......................... | H01S 5/12 |
| | | | | 372/29.013 |
| 2015/0063394 A1* | 3/2015 | Iwata | ...................... | H01L 24/83 |
| | | | | 372/45.01 |
| 2020/0412086 A1* | 12/2020 | Tsuji | ...................... | H01S 5/0238 |

* cited by examiner

*Primary Examiner* — Minsun O Harvey
*Assistant Examiner* — Fernanda Adriana Camacho Alanis
(74) *Attorney, Agent, or Firm* — Che-Yang Chen

(57) ABSTRACT

The present invention relates to a unitized laser chip with double topological structures, which comprises a first topological structure, a second topological structure and a substrate, the first topological structure and the second topological structure are simultaneously arranged on the substrate, and the unitized laser chip is formed by the first topological structure, the second topological structure and the substrate. The first topological structure comprises a first active area, a first electrode bonding pad and a first wire connected between the first active area and the first electrode bonding pad, and the second topological structure comprises a second active area, a second electrode bonding pad and a second wire connected between the second active area and the second electrode bonding pad. The first topological structure and the second topological structure are obliquely arranged on the substrate at the same time.

3 Claims, 12 Drawing Sheets

UNITIZED LASER CHIP WITH DOUBLE TOPOLOGICAL STRUCTURES

BACKGROUND OF THE PRESENT INVENTION

Field of Invention

The present invention relates to a laser chip, in particular a laser chip with double topological structures.

Description of Related Arts

In the field of optical communications, the cost of a vertical cavity surface emitter laser (VCSEL) used in an optoelectronic module is calculated by the number of VCSEL chips that can be produced on average by a wafer, the more that the VCSEL chips can be produced by per wafer, the lower the manufacturing price of individual VCSEL chips is, thus the smaller the area of individual VCSEL chips is, the more that the VCSELs can be produced by per wafer, the lower that the cost of individual VCSEL chips is, and the lower the cost of VCSEL chips required in per product in a conventional multi-channel optical communication system is.

As shown in FIG. 1, in conventional multi-channel optical fiber system, VCSEL chips used by prior art solutions are single topological structure. The VCSEL chips include substrate 1, active area (light emitting area) 2, positive electrode pad 3 and negative electrode pad 4, wherein positive electrode pad 3 and negative electrode pad 4 are connected to active area 2 by wires 5.

As shown in FIG. 2, in multi-channel transmission of conventional optical communications, the fiber specification has been fixed, with a fiber primary core diameter of 125 microns plus coating layer thickness. The spacing 6 between the central positions of two adjacent channels of all universal fiber arrays is 250 microns, if there are multiple channels, the minimum spacing between channels is also 250 microns, and this is common knowledge for the optical communication system.

Driving chips, lasers, optics, and optical fibers in conventional optical communication systems on the market are designed and used at intervals of 250 microns. To fit multi-channel transmission in conventional optical communication systems, the standard spacing 7 between active areas 2 in the VCSEL chip is also 250 microns.

As shown in FIG. 2, in a multi-channel optical fiber system, taking four channels as an example, considering the 250 microns spacing limit between two adjacent channels, the laser arrays consisting of single topology VCSEL chips, subject to the laser single topology limit, the distance between each two adjacent active areas 2 must be at a distance of 250 microns to be matched with optical fiber 8.

Taking four channels as example again, there are four optical fibers 8 in four channels system, thus one chip unit 9 muse be formed by four VCSEL, and is directly butted with four optical fibers 8 for ease of assembly.

As shown in FIG. 3 and FIG. 4, as mentioned above, in accordance with the arrangement of a conventional chip wafer, not only the spacing 7 between the active areas 2 in one chip unit 9 is in a fixed value (250 microns), but also the spacing of two adjacent chip units 9 must be in a fixed value (250 microns), such placement of wafer must result in the wasting of area, and greatly increase the cost of individual VCSEL chip. The source of the problem is that the spacing of two adjacent chip units 9 must also be a fixed value (250 microns).

As shown in FIG. 2 to FIG. 4, as described above, the main drawbacks of the prior art are summarized as follows, to cooperate with the multi-channel transmission of conventional optical communications, the standard spacing of the center active area channel of the VCSEL chips is equal to 250 microns, limited by the arrangement of single topology VCSEL chip wafer, such that the distance between each two adjacent chip units 9 must also be 250 microns, thus in a multi-channel optical fiber system, the wafer arrangement described above does not meet the production needs when the cost of laser array required for a single product needs to be lower (providing more chip units 9 on the same wafer), which is a major drawback of the prior art.

SUMMARY OF THE PRESENT INVENTION

The technical solution of the present invention is that the unitized laser chip with double topological structures includes a first topological structure, a second topological structure and a substrate.

The first topological structure and the second topological structure are simultaneously arranged on the substrate, and the unitized laser chip is formed by the first topological structure, the second topological structure and the substrate.

The first topological structure comprises a first active area, a first electrode pad and a first wire connected between the first active area and the first electrode pad.

Similar to the first topological structure, the second topological structure comprises a second active area, a second electrode pad and a second wire connected between the second active area and the second electrode pad.

The first topological structure and the second topological structure are obliquely arranged on the substrate at the same time.

The advantages of the present invention are that when several of the unitized laser chips of the present invention are arranged on a wafer, for any two unitized laser chips adjacent left and right, the distance between the center points of the first active area of one unitized laser chips and the second active area of the other unitized laser chip is D2, the distance between the center of the first active area and the second active area on one of the unitized laser chips is D1.

In the present invention, D2 is much smaller than D1, but in the prior art, D2 is equal to D1, so that the number of laser chips arranged on a wafer is limited, and the design concept of the present invention is to allow more laser chips to be arranged on a wafer of the same area by reducing D2 to achieve a much lower cost.

DETAILED DESCRIPTION OF THE PREFERRED EMBODIMENT

Figure 5:
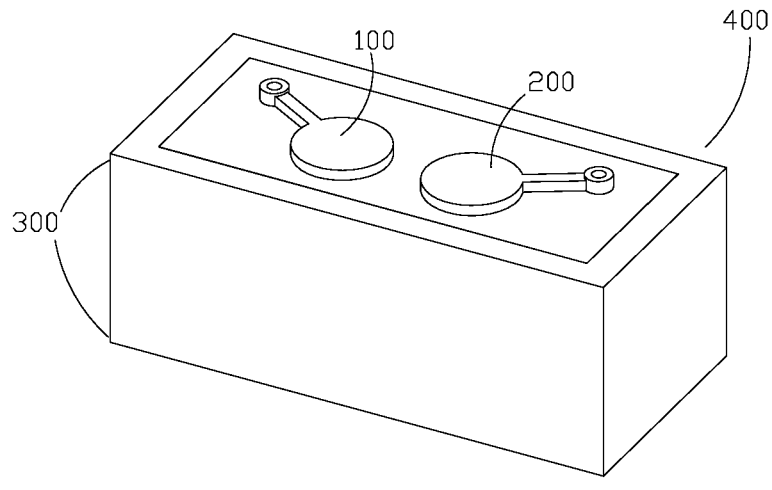
FIG. 5 is a perspective view of a unitized laser chip of the present invention.
Figure 6:
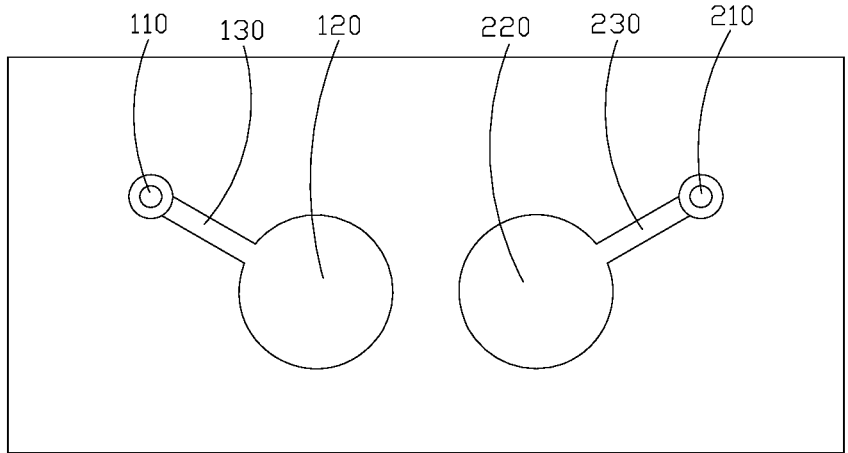
FIG. 6 is a top view of a unitized laser chip of the present invention.
Figure 7:
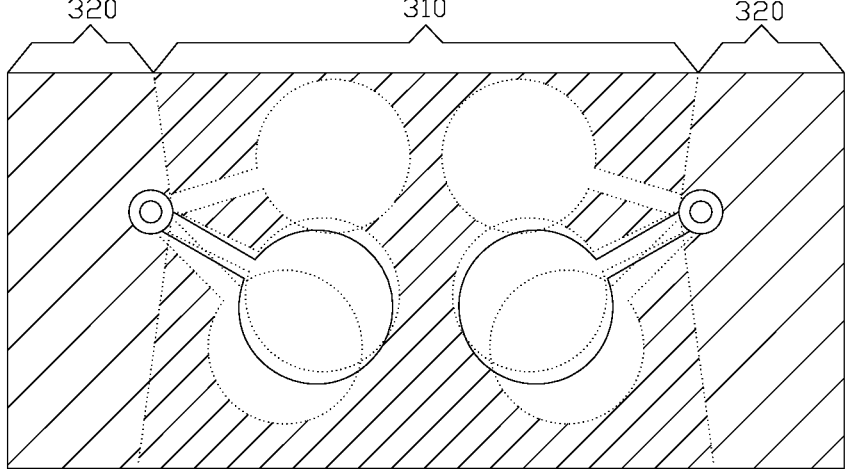
FIG. 7 is a drawing of a functional area and an empty avoidance area of the present invention.

As shown in FIG. 5 to FIG. 7, a unitized laser chip with double topological structures includes a first topological structure 100, a second topological structure 200 and a substrate 300.

As shown in FIG. 5, the first topological structure 100 and the second topological structure 200 are simultaneously arranged on the substrate 300, and a unitized laser chip 400 is formed by the first topological structure 100, the second topological structure 200 and the substrate 300.

As shown in FIG. 6, the first topological structure 100 comprises a first active area 110, a first electrode pad 120 and a first wire 130 connected between the first active area 110 and the first electrode pad 120.

Similar to the first topological structure 100, the second topological structure 200 comprises a second active area 210, a second electrode pad 220 and a second wire 230 connected between the second active area 210 and the second electrode pad, the first topological structure 100 and the second topological structure 200 are obliquely arranged on the substrate 300 at the same time.

As shown in FIG. 7, an area on the substrate 300 between the first active area 110 and the second active area 210 is a functional area 310, an area outside the functional area 310 is an empty avoidance area 320, the first electrode pad 120, the first wire 130, the second electrode pad 220 and the second wire 230 are all disposed in the functional area 310.

Figure 8:
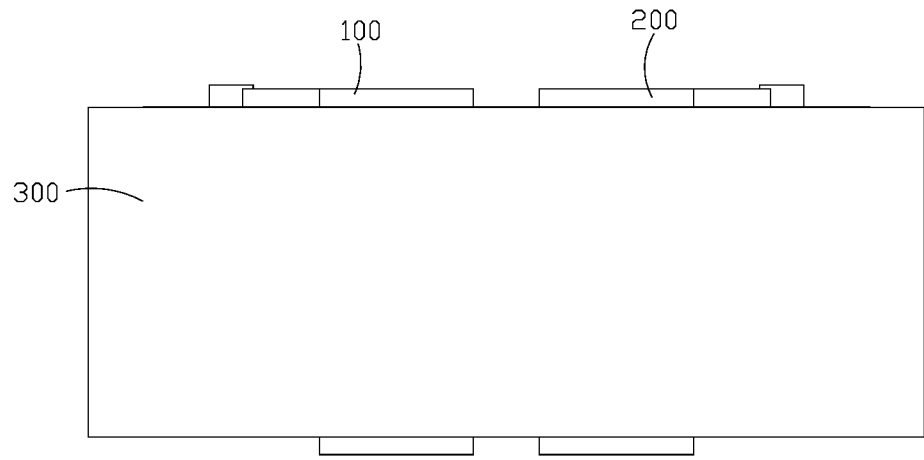
FIG. 8 is a side view of a unitized laser chip of the present invention.

As shown in FIG. 8, in the specific implementation, the first electrode pad and the second electrode pad are positive electrode pads. In practice, both the first topological structures and second topological structures comprise a negative electrode pad stacked on bottom surface of the substrate in correspondence with the positive electrode pad. The negative electrode pad is typically connected to control chips or other components via printed circuits or wires or the like.

Figure 9:
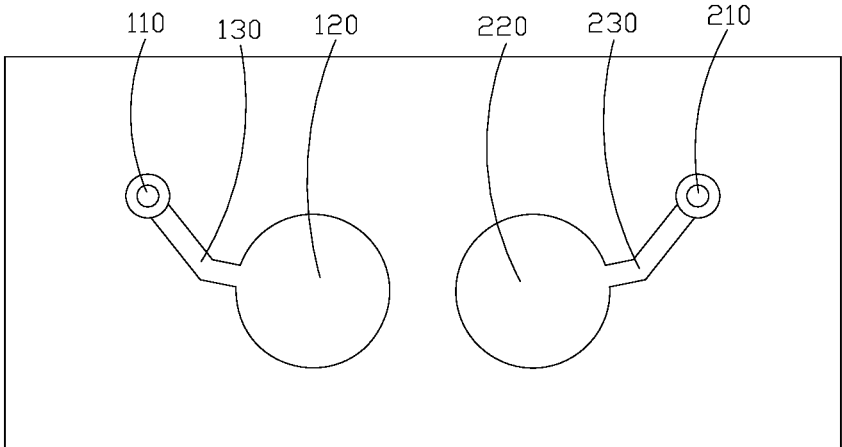
FIG. 9 is a drawing of a first wire and a second wire of the present invention.

As shown in FIG. 9, in the specific implementation, the first wire 130 and the second wire 230 may be straight wires or planar curved or bent wires, or wires of other configurations.

As shown in FIG. 8, the substrate 300 has a transverse side and a vertical side.

In the specific implementation, the transverse side comprises a top side 330 and a bottom side 340, the vertical side comprises a left side 350 and a right side 360, around which a top face 370 is formed, on which the first topological structures 100 and the second topological structures 200 are disposed.

The connecting line between the first active area 110 and the center of the first electrode pad 120 is a first inclined line 131. The connecting line between the second active area 210 and the center point of the second electrode pad 220 is a second inclined line 231. The first inclined line 131 may be central axis of the first wire 130 and second inclined line 231 may be central axis of the second wire 230.

The first inclined line 131 intersects the transverse side to form a first angle A1. The second inclined line 231 intersects the transverse side to form a second angle A2.

In the specific implementation, the first angle A1 and the second angle A2 may be equal, that is, the first topological structures 100 and the second t topological structures 200 have the same direction and same inclination angle, the first angle A1 and the second angle A2 can also be not equal.

The first angle A1 and second angle A2 may be at range of −90° to 90°, i.e. more than negative ninety degrees and less than positive ninety degrees.

When the first angle A1 and the second angle A2 are in the value range said above, the area which the first electrode pad 120, the first wire 130 and the second electrode pad 230 can be provided in is the functional area 310. It is worth explaining that when A1 and A2 are out of the range said above, the structure will increase the width of the unitized laser chip 400, and this is depart from the original intension of the present invention.

Figure 10:
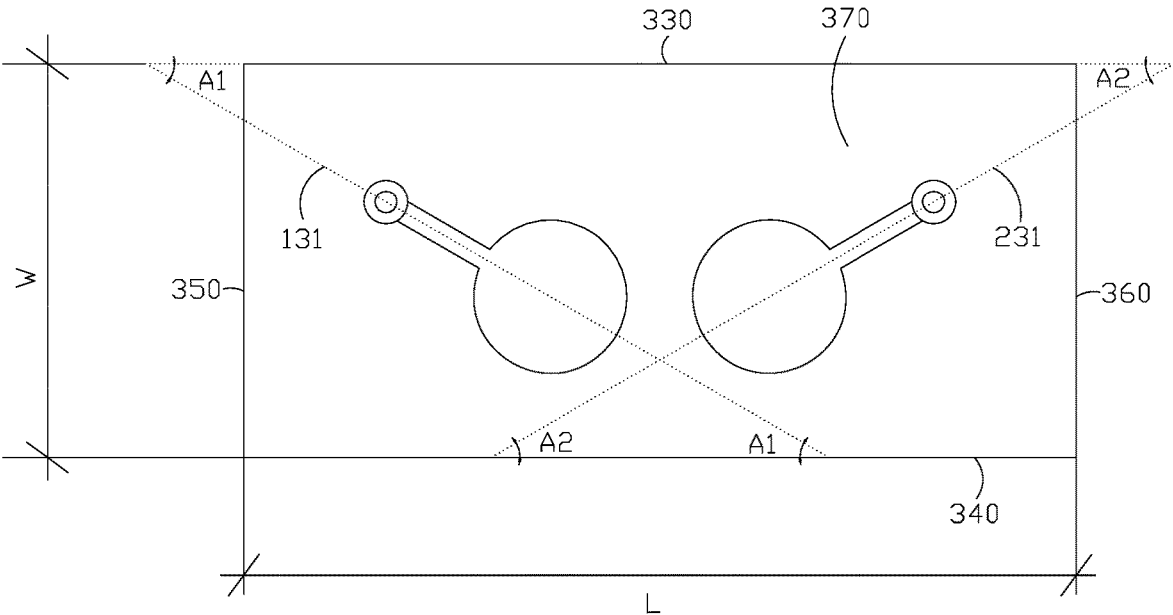
FIG. 10 is a drawing of a first topology and a second topology of the present invention disposed on a substrate.
Figure 11:
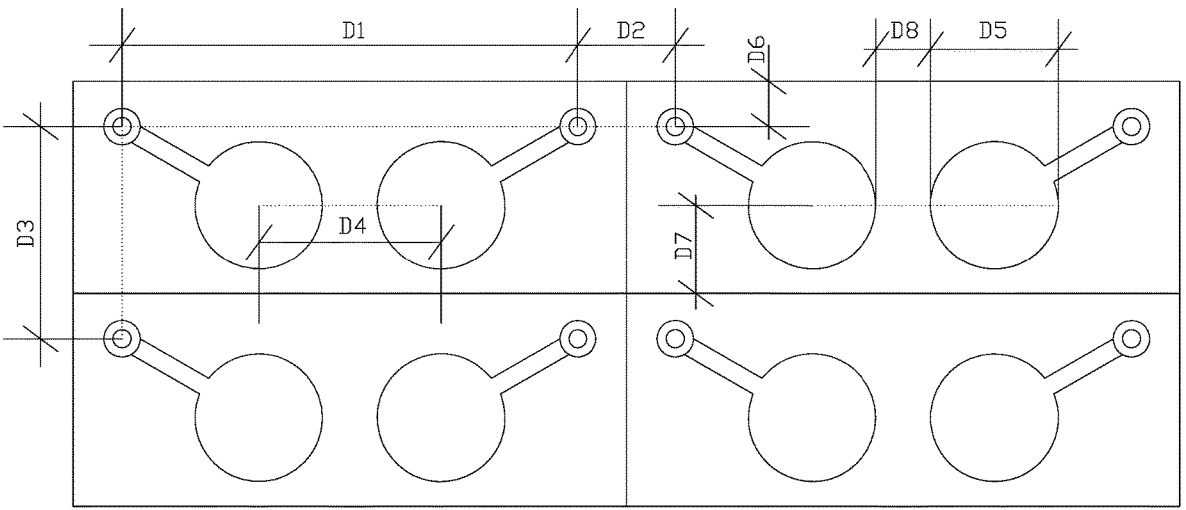
FIG. 11 is a drawing of the arrangement of several unit laser chips of the present invention.

As shown in FIGS. 10 and 11, in practice, the length of the transverse side is L and the length of the vertical side is W.

The distance between the center points of the first active area 110 and the second active area 210 on one of the unitized laser chips 400 is D1 which is a fixed value, in practice, the fixed value is 250 Micron.

When several unitized laser chips 400 are arranged on a wafer, for any two unitized laser chips 400 adjacent left and right, the distance between the center points of the first active area 110 of one unitized laser chips 400 and the second active area 210 of the other unitized laser chip 400 is D2 which is not a fixed value.

When several unitized laser chips 400 are arranged on a wafer, for any two unitized laser chips 400 adjacent above and below, the distance between the center points of the first active areas 110 of the two unitized laser chips 400 is D3 which is not a fixed value.

The distance between the center points of the first electrode pad 120 and the second electrode pad 220 on one of the unitized laser chips 400 is D4 which is not a fixed value.

The diameters of the first electrode pad 120 and the second electrode pad 220 are D5 which is not a fixed value.

The center points of the first active area 110 and the second active area 210 are at a vertical distance D6 from the nearest lateral side, and D6 is not a fixed value.

The center points of the first electrode pad 120 and the second electrode pad 220 are at a vertical distance D7 from the nearest lateral side, and D7 is not a fixed value.

The distance between the edges of the first electrode pad 120 and the second electrode pad 220 on one of unitized laser chips 400 is D8 which is not a fixed value.

As described above, the calculation formula between A1, A2, W, L, D1, D2, D3, D4, D5, D6, D7 and D8 is as follow.

D1 is a fixed value, L=D1+D2, W=D3, D4=D5+D8, $$W=D6+D7+[(D1-D4)/2]\times\tan A1.$$

Wherein if A1=A2, A1 takes value A1 or A2, if A1 #A2, A1 takes the larger absolute value of A1 and A2.

Specific calculations for above calculation formulas are exemplified as follows.

D1 preferably takes value of 250 μm and is constant.

The size of D2 is variable, but D2 is not function of A1 and A2, and it is between 100 μm and 200 μm in terms of production and cost (efficient use of wafer area), if D2 is too small, the wafer can not be cut, if D2 is too large, the area and cost will be increased, so D2 is preferably 130 μm.

The size of L is variable, and L=D1+D2. In line with principles described above, L is in range of 350 μm to 450 μm, and preferably 380 μm.

The size of W is variable, and W=D3. W is a variation parameter of A1 and A2, W=D6+D7+[(D1−D4)/2]×tan A1, and W preferably takes value of 180 μm.

The size of D5 is variable, and D5 is in range of 50 μm to 90 μm. If D5 is too small, the gold wire is not easy to be processed, if D5 is too large, the area of the pad will be increased, and cost also be increased, so D5 is preferably 70 μm.

The size of D8 is variable, and D8 is in range of 20 μm to 40 μm. If D8 is too small, the products can not be produced by the equipment and process of present (the spacing of PAD is too small to be produced), if D2 is too large, the cost will be influenced, so D8 is preferably 30 μm. D4=D5+D8, so D4 is determined according to D8, and D4 is in range of 70 μm to 130 μm, preferably 100 μm.

The size of D6 is variable, and D6 is in range of 50 μm to 80 μm. If D6 is too small, the wafer can not be cut, if D6 is too large, the cost will be influenced, so D6 is preferably 65 μm.

The size of D7 is variable, and D7 is in range of 50 μm to 90 μm. If D7 is too small, the wafer can not be cut, if D7 is too large, the cost will be influenced, so D7 is preferably 72 μm.

The values of A1 and A2 are limited in the range of −90° to 90°, i.e. more than negative ninety degrees and less than positive ninety degrees.

The values of A1 and A2 are preferred 20° to 40° or −40° to −20°. If A1 and A2 are too small, D8 will be too small to be produced, if A1 and A2 are too large, the cost will be influenced, so A1 and A2 are preferably −30° to 30°.

The preferred values of D6, D7, D1, D4 and A1 are substituted into equation for W, wherein D1 is a fixed value.

L=D1+D2, W=D3, D4=D5+D8, W=D6+D7+[(D1−D4)/2]×tan A1.

D6=65 μm, D7=72 μm, D1=250 μm, D4=100 μm, D5=70 μm, D8=30 μm, A1=A2=30°.

It is calculated that W=D3=65+72+[(250−100/2)×tan 30 o=180 μm, which is preferred value of W.

The preferred values of D6, D7, D1, D4 and A1 are substituted into equation for W.

50 μm<D6<80 μm, 50 μm<D7<90 μm, D1=250 μm.

70 μm<D4<130 μm, 20 o<A1<40°.

It is calculated that W is in range of 140 μm to 320 μm, which is preferred range of W.

It is worth explaining that when A1≠A2, A1 takes the larger absolute value of A1 and A2 as the angle value, and is substituted into the equation W=D3 said above.

In the present invention, D2 is much smaller than D1. In the prior art, D2 is equal to D1, so the number of laser chips arranged on a wafer is limited. The design concept of the present invention is arranging more laser chips on a wafer by reducing D2, and achieving the object of a much lower cost.

Figure 1:
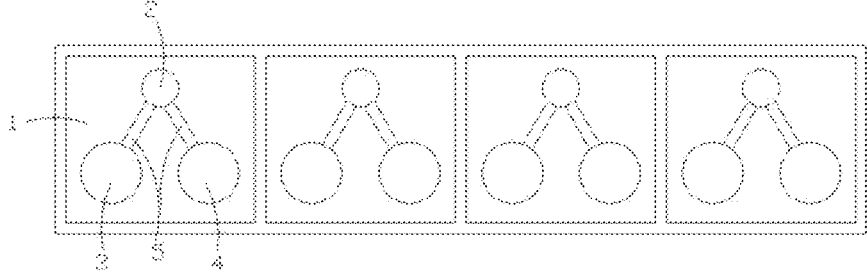
FIG. 1 is a drawing of conventional chip.
Figure 2:
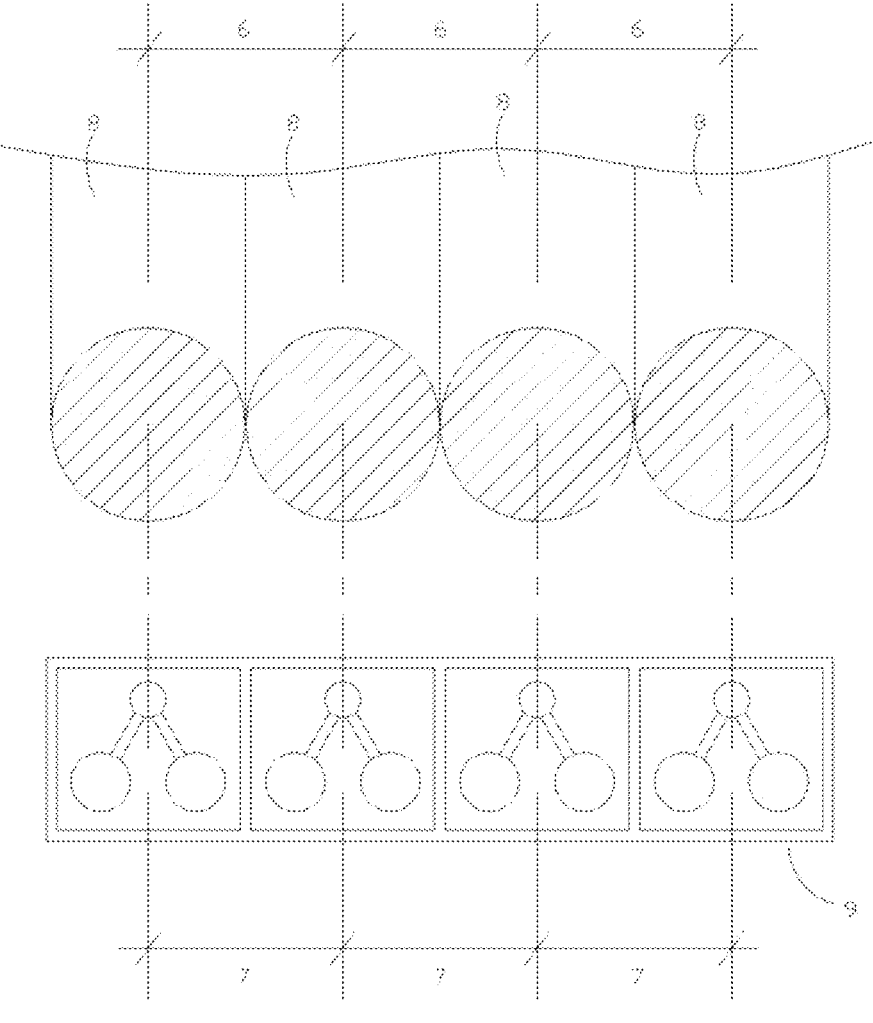
FIG. 2 is a drawing of conventional chip connected with the fiber.
Figure 3:
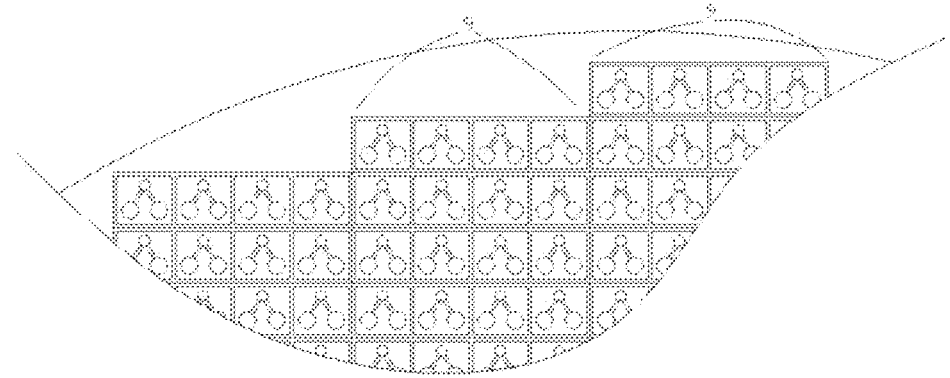
FIG. 3 is a drawing of conventional chips arranged on wafer.
Figure 4:
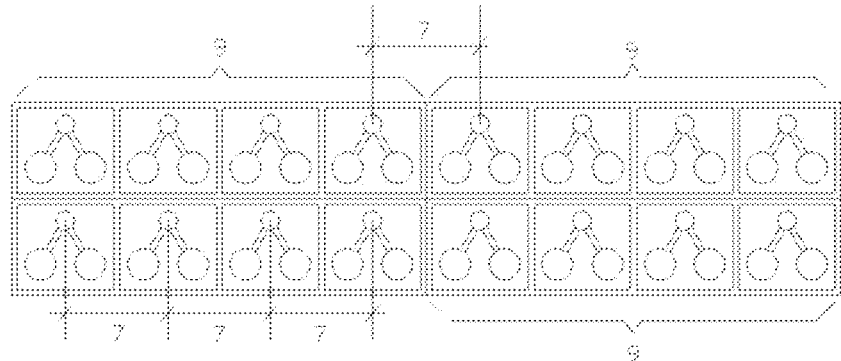
FIG. 4 is a drawing of arrangement of the conventional chips.
Figure 12:
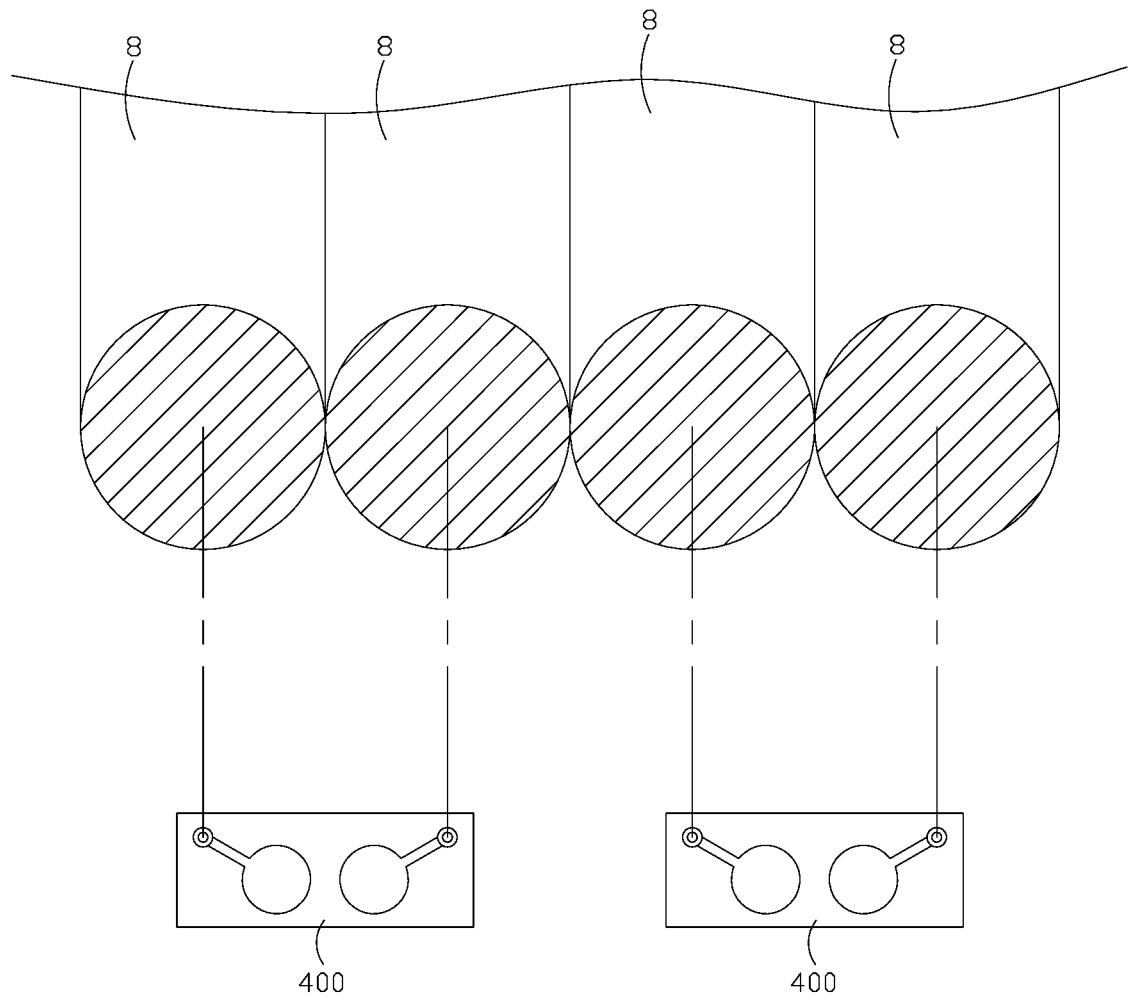
FIG. 12 is a drawing of a unitized laser chip of the present invention butted with the fiber.

As shown in FIG. 2 and FIG. 3, taking four channels as an example, several chip units 9 are designed directly on a wafer in conventional technology, after processing, the chip units 9 are cut and divided, then, one chip unit 9 is directly butted with four optical fibers 8, thereby completing the assembly. As shown in FIG. 12, the assembly process for the product according to the invention is as follows. First, designing several unitized laser chips 400 on a wafer, and adjusting the spacing D2 and D3 to allow more laser chips be arranged on a wafer of the same area. Second, cutting apart the unitized laser chips 400, take four channels as an example, and butting two unitized laser chips 400 directly with four optical fibers 8, then finishing the assembly. The butting effect of the present invention is in accordance with conventional techniques, but with much wafer area savings and great cost reduction.

In addition, inventor of the present invention additionally explains the practical implications of the design concept of the present invention by changing the original single topology to a double topology to shorten the pitch of each two adjacent laser chips, thereby reducing the cost of the product.

The present invention firstly achieves the effect of high density integration, the smaller the VCSEL chip area is, the more advantageous for the miniaturization of integrated modules at high density in photoelectric conversion and optical communication. The dual topology disclosed herein allows the distance between two adjacent optical channels to be reduced from 250 μm to 130 μm, and reduces the area of the VCSEL chip of the same laser arrangement to ¾ of the original, and results in high integration density.

Secondly, the invention achieves a low cost. For semiconductor laser chips, the more the laser chips integrated on a 4 or 6 inch wafer are, the lower the cost of a single laser chip is. With the technology of the present invention, the cost of a single laser chip can be reduced to approximately ¼ of the original cost due to the large reduction in area of the single laser chip.

As described above, since this unitized laser chip 400 belongs to micron-scale components, it needs to be assembled and welded by high precision automated equipment when doing the assembly welds, which generally requires multiple imaging and positioning by multiple HD cameras, and is assisted by high-end optical positioning means to complete assembling and soldering of the laser chip. In particular the mechanical transmission part of such an automated equipment requires high structural precision, which entails that such equipment is expensive to purchase, and in order to meet the need for high volume production, producers often need to purchase multiple pieces of equipment to meet their yield requirements, which results in a significant increase of the costs.

According to the structural features of unitized laser chip 400, inventor of the present invention has proposed assembly processes that can greatly reduce assembly soldering costs of laser chip, as described below.

Figure 13:
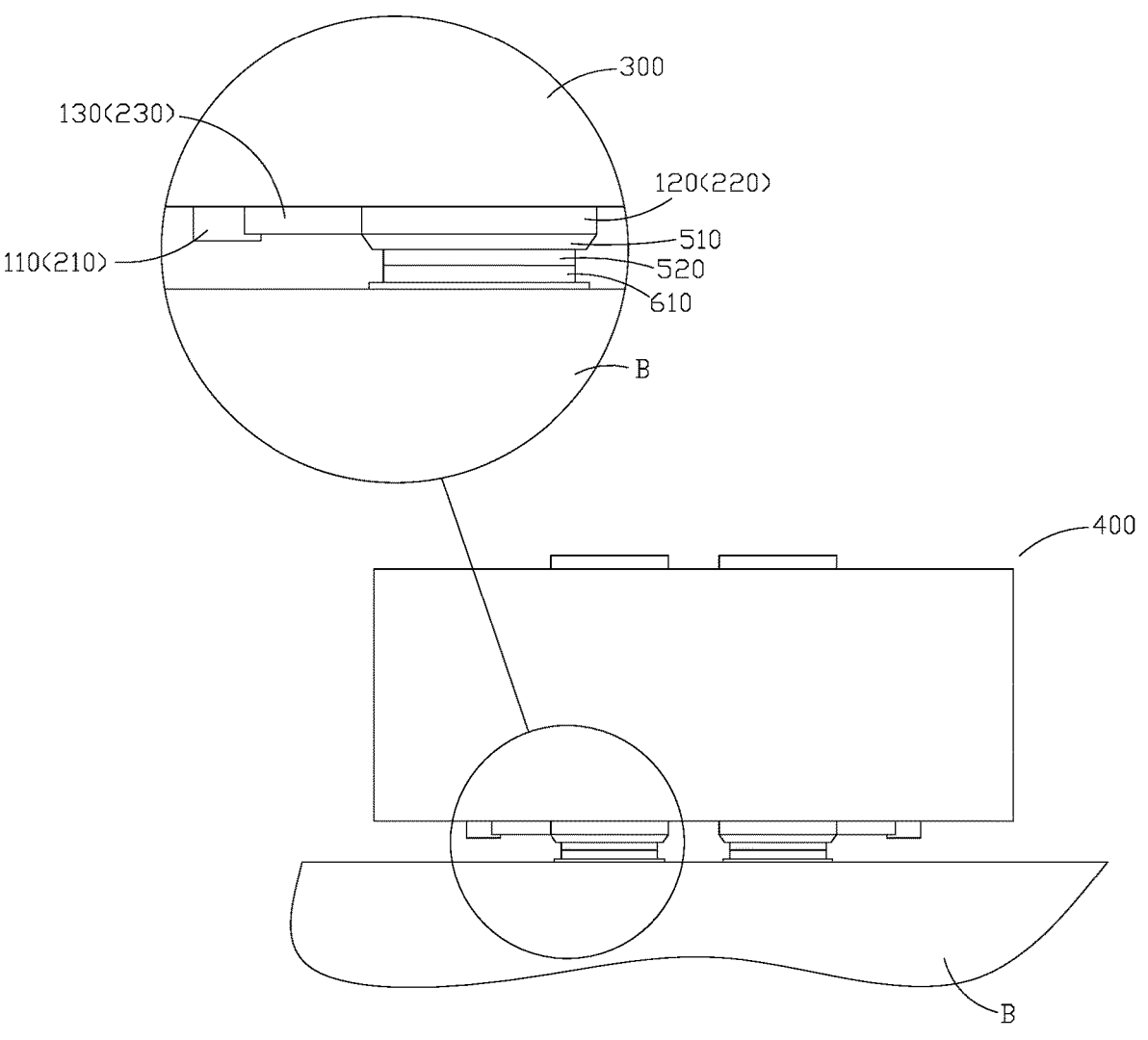
FIG. 13 is a drawing of the assembly of a unitized laser chip of the present invention placed on a circuit board.
Figure 14:
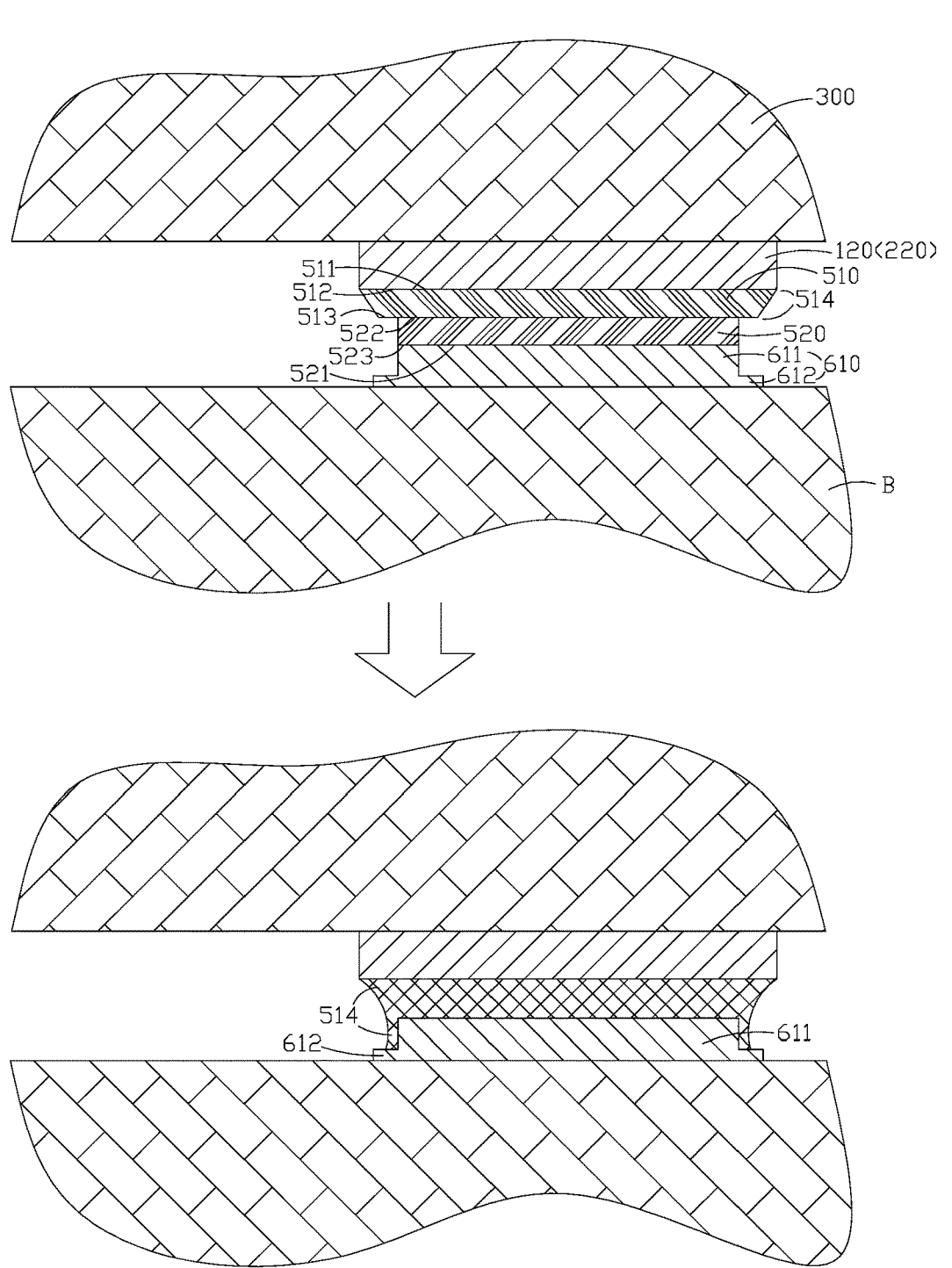
FIG. 14 is a drawing of the welding process of the unitized laser chips of the present invention.

As shown in FIG. 13 and FIG. 14, the unitized laser chip is assembled and soldered according to the following steps.

First, providing a chip solder layer 510 respectively on the first electrode pad 120 and the second electrode pad 220 of the unitized laser chip 400.

Second, making two butt pads 610 on the circuit board B, the two butt pads 610 are corresponded to the first electrode pad 120 and the second electrode pad 220 respectively. On each of the butt pads 610 a butt solder layer 520 is provided.

Third, placing the unitized laser chip 400 on the circuit board B, such that the chip solder layer 510 respectively provided on the first electrode pad 120 and the second electrode pad 220 is stacked on the butt solder layer 520 of each of the two butt pads 610 respectively.

Fourth, heating up the circuit board B and the unitized laser chip 400, and making the chip solder layer 510 and the butt solder layer 520 melted and thermally fused together.

In the fourth step, the chip solder layer 510 and the butt solder layer 520 are firstly melted and self-aligned via surface tension of the liquid, and then thermally fused together. Since the chip solder layer 510 and butt solder layer 520 are micro-scale structures, their physical dimensions allow them to be self-aligned as said above.

Fifth, cooling down the circuit board B and the unitized laser chip 400, so the chip solder layer 510 and the butt solder layer 520 are cooled and joined together to complete the overall solder assembly process.

In practice, a plurality of the unitized laser chips 400 may be placed simultaneously on the same or different circuit boards, and are simultaneously assembled and welded, so realize batch producing. At the time of batch producing, this can be carried out by means of being transported into a heating furnace and a cooling furnace with conveyer belt, in order to improve efficiency and reduce costs. For example, the unitized laser chip 400 and the circuit board can be transported into a heating furnace via a conveyor belt to complete the fourth step described above, and can be transported into a cooling furnace via a conveyor belt to complete the fifth step described above.

In the specific implementation, both the first electrode pad 120 and the second electrode pad 220 have a pad contact surface 511 in the first step said above. The chip solder layer 510 has a solder layer top surface 512 and a bottom surface 513. The top surface 512 is connected to the pad contact surface 511 and has an area equal to the pad contact surface 511. The area of the bottom surface 513 is smaller than the solder layer top surface 512.

The chip solder layer 510 includes an overflow area 514 looped around the edge of the chip solder layer 510.

In the second step said above, the butt pad 610 has a contact surface 521.

The butt solder layer 520 has a top surface 522 butted on the solder layer bottom surface 513 of the chip solder layer 510 and a bottom surface 523 connected to the contact surface 521 of the butt pad 610. The contact surface 521, the top surface 522 and the bottom surface 523 all have an area smaller than the solder layer bottom surface 513.

The butt pad 610 includes a pad post 611 and a chassis 612 corresponding to the overflow area 514 of the chip solder layer 510. The said chassis 612 is looped around the pad post 611.

In the fourth step said above, the melting point of the butt solder layer 520 is higher than the chip solder layer 510. The chip solder layer 510 and the butt solder layer 520 are melted and fused together according to the following steps.

Step 1, after the circuit board B and the unitized laser chip 400 being heated up, the chip solder layer 510 is first melted, and the unitized laser chip 400 moves downward by gravity, and the butt solder layer 520 enters into the melted chip solder layer 510. The overflow area 514 of the chip solder layer 510 melts and flows down along the pad post 611 and forms the supporting above the chassis 612.

Step two, the bulk temperature continues to increase, so the butt solder layer 520 is melted and fused together with the chip solder layer 510.

In the second step, wrapping of butt solder layer 520 formed by melting of the overflow area 514 can accelerate melting of butt solder layer 520.

In the fifth step, after the chip solder layer 510 and butt solder layer 520 being cooled and joined together, the overflow area 514 is wrapped around pad post 611, and is mounted above the chassis 612.

In the specific implementation, the area of the top surface of the substrate 300 of the unitized laser chip 400 is S1, and S1=W×L. The pad contact surface 511 of the first electrode pad 120 and the second electrode pad 220 has an area S2, and the relationship between S1 and S2 is 1/16×S1<S2<1/10×S1. The area correspondence between S1 and S2 can be determined according to the relationship said above, so that the placement of the unitized laser chip 400 is more stable, and the melting and fusion process is further smooth.

In the specific implementation, the selections of materials and melting points of chip solder layer 501 and butt solder layer 520 are known in art, and materials can be gold, silver, tin, etc., or mixtures thereof with other additives which is not described herein.

What is claimed is:

1. A unitized laser chip (400) with double topological structures, comprising a first topological structure (100), a second topological structure (200) and a substrate (300), the first topological structure (100) and the second topological structure (200) are arranged on the substrate (300), and the unitized laser chip (400) is formed by the first topological structure (100), the second topological structure (200) and the substrate (300), the first topological structure (100) comprises a first active area (110), a first electrode pad (120) and a first wire (130) connected between the first active area (110) and the first electrode pad (120), similar to the first topological structure (100), the second topological structure (200) comprises a second active area (210), a second electrode pad (220) and a second wire (230) connected between the second active area (210) and the second electrode pad, the first topological structure (100) and the second topological structure (200) are obliquely arranged on the substrate (300)

wherein, an area on the substrate (300) between the first active area (110) and the second active area (210) is a functional area (310), an area outside the functional area (310) is an empty avoidance area (320), the first electrode pad (120), the first wire (130), the second electrode pad (220) and the second wire (230) are all disposed in the functional area (310), wherein, the substrate (300) has a transverse side and a vertical side, the transverse side comprises a top side (330) and a bottom side (340), the vertical side comprises a left side (350) and a right side (360) that are two sides of a top face (370) on which the first topological structures (100) and the second topological structures (200) are disposed, a connecting line between the first active area (110) and the center of the first electrode pad (120) is a first inclined line (131) and the connecting line between the second active area (210) and the center point of the second electrode pad (220) is a second inclined line (231), the first inclined line (131) intersects an edge of the top side (330) to form a first angle A1 and the second inclined line (231) intersects the edge of the top side (330) to form a second angle A2, the length of the transverse side is L and the length of the vertical side is W, the distance between the center points of the first active area (110) and the second active area (210) on the unitized laser chip (400) is D1 which is a fixed value, when several of the unitized laser chips (400) are arranged on a wafer, for any two unitized laser chips (400) adjacent left and right, the distance between the center points of the first active area (110) of one unitized laser chips (400) and the second active area (210) of the other unitized laser chip (400) is D2, when several of the unitized laser chips (400) are arranged on a wafer, for any two unitized laser chips (400) adjacent above and below, the distance between the center points of the first active areas (110) of the two unitized laser chips (400) is D3, the distance between the center points of the first electrode pad (120) and the second electrode pad (220) on one of the unitized laser chips (400) is D4, the diameters of the first electrode pad (120) and the second electrode pad (220) are D5, the center points of the first active area (110) and the second active area (210) are at a vertical distance D6 from the nearest lateral side, the center points of the first electrode pad (120) and the second electrode pad (220) are at a vertical distance D7 from the nearest lateral side, the distance between the edges of the first electrode pad (120) and the second electrode pad (220) on one of unitized laser chips (400) is D8, wherein, the calculation formula between A1, A2, W, L, D1, D2, D3, D4, D5, D6, D7, D8 is, D1 is a fixed value, L=D1+D2, W=D3, D4=D5+D8, $$W = D6 + D7 + [(D1 - D4)/2] \times \tan A1,$$

wherein if A1=A2, A1 takes value A1 or A2, if A1 #A2, A1 takes the larger absolute value of A1 and A2.

2. A unitized laser chip (400) with double topological structures, comprising a first topological structure (100), a second topological structure (200) and a substrate (300), the first topological structure (100) and the second topological structure (200) are arranged on the substrate (300), and the unitized laser chip (400) is formed by the first topological structure (100), the second topological structure (200) and the substrate (300), the first topological structure (100) comprises a first active area (110), a first electrode pad (120) and a first wire (130) connected between the first active area (110) and the first electrode pad (120), similar to the first topological structure (100), the second topological structure (200) comprises a second active area (210), a second electrode pad (220) and a second wire (230) connected between the second active area (210) and the second electrode pad, the first topological structure (100) and the second topological structure (200) are obliquely arranged on the substrate (300), wherein, the unitized laser chip is assembled and soldered according to the following steps:

first, providing a chip solder layer (510) respectively on the first electrode pad (120) and the second electrode pad (220) of the unitized laser chip (400), second, making two butt pads (610) on a circuit board (B), the two butt pads (610) are corresponded to the first electrode pad (120) and the second electrode pad (220) respectively, a butt solder layer (520) is provided on each of the two butt pads (610), third, placing the unitized laser chip (400) on the circuit board (B) such that the chip solder layer (510) respectively provided on the first electrode pad (120) and the second electrode pad (220) is stacked on the butt solder layer (520) of each of the two butt pads (610) respectively, fourth, heating up the circuit board (B) and the unitized laser chip (400), and making the chip solder layer (510) and the butt solder layer (520) melted and thermally fused together, in the fourth step, the chip solder layer (510) and the butt solder layer (520) are firstly melted and self-aligned via surface tension of the liquid, and then thermally fused together, fifth, cooling down the circuit board (B) and the unitized laser chip (400), so the chip solder layer (510) and the butt solder layer (520) are cooled and joined together to complete the overall solder assembly process.

3. The unitized laser chip (400) with double topological structures according to claim 2, wherein, in the first step said above, both the first electrode pad (120) and the second electrode pad (220) have a pad contact surface (511), the chip solder layer (510) has a solder layer top surface (512) and a bottom surface (513), the solder layer top surface (512) is connected to the pad contact surface (511) and has an area equal to the pad contact surface (511), the area of the bottom surface (513) is smaller than the solder layer top surface (512), the chip solder layer (510) includes an overflow area (514) looped around the edge of the chip solder layer (510), in the second step said above, each of the two butt pads (610) has a contact surface (521), the butt solder layer (520) has a top surface (522) butted on the solder layer bottom surface (513) of the chip solder layer (510) and a bottom surface (523) connected to the contact surface (521) of each of the two butt pads (610), the contact surface (521), the top surface (522) and the bottom surface (523) all have an area smaller than the solder layer bottom surface (513), each of the two butt pads (610) includes a pad post (611) and a chassis (612) corresponding to the overflow area (514) of the chip solder layer (510), the said chassis (612) is looped around the pad post (611), in the fourth step said above, the melting point of the butt solder layer (520) is higher than the chip solder layer (510), the chip solder layer (510) and the butt solder layer (520) are melted and fused together according to the following steps, step one, after heating up the circuit board (B) and the unitized laser chip (400), the chip solder layer (510) is first melted, the unitized laser chip (400) moves downward by gravity, the butt solder layer (520) enters into the melted chip solder layer (510), the overflow area (514) of the chip solder layer (510) melts and flows down along the pad post (611) and forms the support above the chassis (612), step two, a bulk temperature continues to increase, the butt solder layer (520) is melted and fused together with the chip solder layer (510), in the fifth step described above, after the chip solder layer (510) and the butt solder layer (520) being cooled and joined together, the overflow area (514) is wrapped around the pad post (611), and the overflow area (514) is mounted above the chassis (612).

* * * * *